United States Patent
Kawamura

(10) Patent No.: US 6,670,669 B1
(45) Date of Patent: Dec. 30, 2003

(54) MULTIPLE-BIT NON-VOLATILE MEMORY UTILIZING NON-CONDUCTIVE CHARGE TRAPPING GATE

(75) Inventor: Shoichi Kawamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/030,117

(22) PCT Filed: Feb. 28, 2000

(86) PCT No.: PCT/JP00/01158

§ 371 (c)(1),
(2), (4) Date: Jan. 23, 2002

(87) PCT Pub. No.: WO01/13378

PCT Pub. Date: Feb. 22, 2001

(30) Foreign Application Priority Data

Aug. 10, 1999 (JP) ............................................ 11-226913

(51) Int. Cl.[7] .............................................. H01L 29/76
(52) U.S. Cl. .......................... 257/314; 257/296; 257/311
(58) Field of Search .................................. 257/314, 318, 257/311, 296

(56) References Cited

U.S. PATENT DOCUMENTS 6,011,725 A * 1/2000 Eitan ...................... 365/185.33
6,255,166 B1 * 7/2001 Ogura et al. ................ 438/257

FOREIGN PATENT DOCUMENTS

JP    A-677498    3/1994
JP    A-11-8325    1/1999

OTHER PUBLICATIONS

Front page of PCT International Publication No. WO 99/0700.

* cited by examiner

Primary Examiner—Richard Elms
Assistant Examiner—Brad Smith

(57) ABSTRACT

The invention is to provide a novel non-volatile memory capable of recording multi-bit data. The invention is a non-volatile memory which has: first and second source-drain regions SD1, SD2 at the surface of a semiconductor substrate; and a non-conductive trapping gate TG, and a conductive control gate CG, formed on a channel region there between via an insulating film. Further, the non-volatile memory has a first or second state in which, by applying a voltage between the first and second source-drain regions SD1, SD2, hot electrons produced in the vicinity of the first or second source-drain region are locally captured in a first or second trapping gate region TSD1, TSD2 in the vicinity of them; and, a third state in which, by applying a voltage between the control gate and the channel region, electrons (or charge) are (is) injected into the entire trapping gate. According to whether or not the above-mentioned third state is adopted, one-bit information can be recorded, and according to whether or not the first and second states are adopted, two-bit information can be recorded. Consequently, information totaling three bits can be recorded in a single memory cell.

10 Claims, 12 Drawing Sheets

(1)

(2)

(1)

(2)

(3)

(5)

(4)

(a)

(b)

(c)

(d)

MULTIPLE-BIT NON-VOLATILE MEMORY UTILIZING NON-CONDUCTIVE CHARGE TRAPPING GATE

TECHNICAL FIELD

The present invention relates to a novel non-volatile memory capable of recording multiple bit information in a single memory cell having a non-conductive charge trapping gate.

BACKGROUND ART

Non-volatile memories that utilize semiconductor are in widespread use as information recording media on account of being capable of retaining information even if the power supply is OFF, and being capable of read-out at high speeds. In recent years, non-volatile memories have been employed in mobile information terminals, and as recording media for digital cameras and for digital music in the form of MP3 data, for example.

Non-volatile memories, such as the flash memories that are currently in widespread use, are constructed so as to have a conductive floating gate and control gate on a channel region between a source region and drain region. A non-volatile memory of this kind is constituted such that a floating gate is buried in a gate insulating film, and one-bit information is stored according to whether charge is or is not injected into this floating gate. Due to the fact that these non-volatile memories of widespread usage have a floating gate that is electrically conductive, when defects, however small, are present in the gate oxide film, electrons in the floating gate are all lost via these defects. There is therefore a problem in that high reliability is unattainable.

Other than the non-volatile memories of widespread usage mentioned above, a new type of non-volatile memory has been proposed that is provided with a non-conductive charge trapping gate in place of a floating gate, and that stores two-bit information by causing charge beside the source and beside the drain to be trapped. For example, a non-volatile memory of this kind is disclosed in the PCT application WO99/07000 "Two Bit Non-volatile Electrically Erasable and Programmable Semiconductor Memory Cell Utilizing Asymmetrical Charge Trapping". Since this non-volatile memory has a trapping gate that is non-conductive, the probability of loss of electrons injected locally is low, whereby it is possible to attain high reliability.

FIG. 1 shows the constitution of the above-mentioned conventional two-bit non-volatile memory. FIG. 1(1) is a cross-sectional view thereof, and FIG. 1(2) is an equivalent circuit diagram thereof. Source-drain regions SD1, SD2 are formed at the surface of a silicon substrate 1, and a trapping gate TG formed from a silicon nitride film or the like, and a control gate CG of a conductive material, are formed on the channel region. The trapping gate TG is buried in the insulating film 2 made of silicon oxide film or the like, to thereby form a composite MONOS (Metal-Oxide-Nitride-Oxide-Semiconductor) structure. By utilizing the difference in bandgap between the silicon nitride film and silicon oxide film, it is possible to cause charge to be trapped and retained in the silicon nitride film.

The special constitution of this non-volatile memory is a trapping gate TG consisting of a non-conductive substance such as a dielectric material, for example, and, in a case in which charge is injected into this trapping gate TG, charge within the trapping gate is unable to move. As a result, it is possible to make a distinction between a case in which charge is injected in the vicinity of the first source-drain region SD1, and a case in which charge is injected in the vicinity of the second source-drain region SD2, and it is thus possible to record two-bit data.

FIG. 1(2) is an equivalent circuit diagram for the above-mentioned two-bit non-volatile memory. Since the trapping gate TG is non-conductive, this trapping gate TG is equivalent to a constitution in which separate MOS transistors are respectively formed in a first trapping gate region TSD1 in the vicinity of the first source-drain region SD1, and in a second trapping gate region TSD2 in the vicinity of the second source-drain region SD2. Further, in the course of the above-described read-out and programming (write) operations, the first and second source-drain regions SD1, SD2 are used either as source regions or drain regions, and these source-drain regions SD1, SD2 are therefore referred to, in this specification, as the first source-drain region SD1 and the second source-drain region SD2, respectively.

FIG. 2 illustrates programming, erasure and read-out of a conventional two-bit non-volatile memory. The voltage applied to the first source-drain region SD1 is called as V(SD1), the voltage applied to the second source-drain region SD2 is called as V(SD2), and the voltage applied to the control gate is called as Vg.

As shown in FIG. 2(1), the programming (write) of the non-volatile storage memory is executed by applying voltages Vg=10V, V(SD1)=0V, V(SD2)=6V, for example, to inject hot electrons produced in the vicinity of the second source-drain region SD2 into the second trapping gate region TSD2 close to the second source-drain region SD2.

In addition, in the course of an erase operation, the voltage applied to the control gate CG is such that Vg=−5V, and 5V is applied to the first or second source-drain region SD1 or SD2, or to both the first source-drain region SD1 and the second source-drain region SD2, to extract electrons from the trapping gate TG by utilizing the FN tunnel effect (the Fowler-Nordheim Tunnel effect). At the same time, hot holes produced in the vicinity of the source-drain regions SD1 and SD2, are injected into the trapping gate TG, so that the charge is neutralized within the trapping gate TG.

Next, the read-out operation involves the application of a voltage, whose bias is the reverse of the voltage of the programming operation, between the first and second source-drain regions SD1, SD2, to detect whether or not electrons are trapped in the second trapping gate region TSD2. In other words, in order to read out the state of the second trapping gate region TSD2, voltages applied are Vg=3V, V(SD1)=1.6V, V(SD2)=0V, for example. Here, as shown in FIG. 2(3), when electrons are present in the second trapping gate region TSD2 in the vicinity of the second source-drain region SD2, the channel below the gate does not extend so as to touch the second source-drain region SD2, and, consequently, a channel current does not flow (0 data storage state). Conversely, as shown in FIG. 2(4), when electrons are not present in the second trapping gate region TSD2 in the vicinity of the second source-drain region SD2, the channel reaches to the second source-drain region SD2, and, consequently, a channel current flows (1 data storage state). It is thus possible to detect whether or not there is an accumulation of electrons in the second trapping gate region TSD2, by detecting the ON and OFF of a cell transistor, that is, the existence of a current.

Furthermore, in read-out of the non-volatile storage memory, when, as shown in FIG. 2(5), voltages applied are: Vg=3V, V(SD1)=0, V(SD2)=1.6V, i. e. when the voltage application state between the first and second source-drain regions is the reverse of that in FIG. 2(3) mentioned above, even if electrons are, for example, present in the second trapping gate region TSD2, the state is the same as a MOS transistor whose channel is pinched off, and a channel current flows. Therefore, in a voltage application state of this kind, it is possible to detect whether or not there is an accumulation of electrons in the first trapping gate region TSDL in the vicinity of the first source-drain region SD1, irrespective of the existence of electrons in the second trapping gate region TSD2.

As described above, a conventional memory is capable of recording two-bit information by means of the accumulation or non-accumulation of electrons in the nitride film region TSD1 in the vicinity of the first source-drain region SD1 and in the nitride film region TSD2 in the vicinity of the second source-drain region SD2. As a result, a conventional memory of this kind is advantageous by virtue of affording a larger capacity and a cost reduction per chip as a result of a reduced chip surface area.

FIG. 3 shows a state in which two-bit information is recorded in the above-mentioned non-volatile memory. In the figure, black spots represent electrons. FIG. 3(1) shows a state data=11 in which electrons are not captured in either of the first or second trapping gate regions TSD1, TSD2. FIG. 3(2) shows a state data=01 in which electrons are captured in the second trapping gate region TSD2. FIG. 3(3) shows a state data=00 in which electrons are captured in the first and second trapping gate regions TSD1,TSD2. Further, FIG. 3(4) shows a state data=10 in which electrons are captured in the first trapping gate region TSD1.

The above-mentioned two-bit non-volatile memory is capable of storing two bits in a single memory cell, and is therefore advantageous by virtue of having a large capacity. However, the demand for a large capacity placed on the most recent non-volatile memories surpasses this single-cell/two-bit storage capacity. In other words, when there is a requirement for the recording of still image data, of music data, or even of moving image data, it is desirable to be able to record an even greater number of bits in a single memory cell.

DISCLOSURE OF THE INVENTION

An object of the present invention is to provide a novel non-volatile memory capable of recording three-bit information in a single memory cell.

A further object of the present invention is to provide a read-out method, a programming method, and an erase method, or the like, for a novel non-volatile memory capable of recording three-bit information in a single memory cell.

In order to achieve the above-mentioned objects, one aspect of the present invention is a non-volatile memory which has: first and second source-drain regions at the surface of a semiconductor substrate; and a non-conductive trapping gate, in an insulating film, and a conductive control gate, which are formed on a channel region between these first and second source-drain regions. Further, the non-volatile memory according to the present invention has a first or second state in which, as a result of the application of a voltage between the first and second source-drain regions, hot electrons produced in the vicinity of the first or second source-drain region are locally captured in a first or second trapping gate region in the vicinity of the first and second source-drain regions, respectively. The non-volatile memory according to the present invention also has a third state in which, as a result of the application of a voltage between the control gate and the channel region, electrons (or charge) are (is) injected into the entire trapping gate.

According to whether or not the above-mentioned third state is adopted, one-bit information can be recorded, and according to whether or not the first and second states are adopted, two-bit information can be recorded. Consequently, information totaling three bits can be recorded in a single memory cell.

In order to achieve the above-mentioned objects, another aspect of the present invention is a non-volatile memory for recording multiple bit information, having: first and second source-drain regions formed at the surface of a semiconductor substrate; and a first insulating layer, a non-conductive trapping gate, a second insulating layer, and a control gate, which are formed on a channel region between the first and second source-drain regions, wherein the non-volatile memory for recording multiple bit information has a first state, in which charge is trapped locally in the above-mentioned trapping gate, and a second state, in which charge is injected into the whole of the above-mentioned trapping gate.

According to the present invention, it is possible to record data that differ in a case where electrons are injected into the whole of the non-conductive trapping gate, and in a case where electrons are injected locally therein. By providing a plurality of positions for local injection, it is possible to record data in greater numbers.

The above-mentioned preferred embodiment of the invention is characterized in that, in writing to the first state, a predetermined voltage is applied between the first and second source-drain regions to inject hot electrons produced in the channel region; and, in writing to the second state, a predetermined voltage is applied between the semiconductor substrate and the control gate to perform tunnel injection of charge.

The above-mentioned preferred embodiment of the invention is characterized in that an erase operation is performed by applying a predetermined erase voltage between the semiconductor substrate and the control gate to extract charge present in the whole of the trapping gate or in localized regions of the trapping gate.

The above-mentioned preferred embodiment of the invention is characterized by having a first read-out voltage, a second read-out voltage, and a third read-out voltage, which differ in sequential order, and in that the second read-out voltage is applied to the control gate to perform read-out to detect the existence of the second state, and, the first or third read-out voltage is applied to the control gate to perform read-out to detect the existence of the first state.

In order to achieve the above-mentioned objects, yet another aspect of the present invention is a non-volatile memory for recording multiple bit information, having: first and second source-drain regions formed at the surface of a semiconductor substrate; and a first insulating layer, a non-conductive trapping gate, a second insulating layer, and a control gate, which are formed on a channel region between the first and second source-drain regions, wherein the non-volatile memory for recording multiple bit information has a first state, in which charge is trapped in a first trapping gate region in the trapping gate, in the vicinity of the first source-drain region, a second state, in which charge is trapped in a second trapping gate region in the trapping gate, in the vicinity of the second source-drain region, and a third state in which charge is injected into the whole of the trapping gate.

BEST MODE FOR CARRYING OUT THE INVENTION

Figure 1:
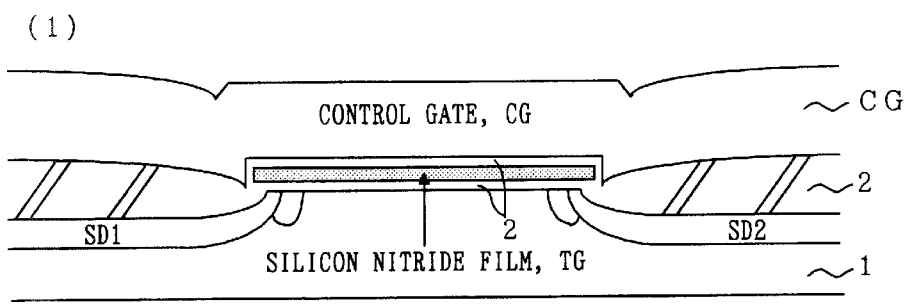
FIG. 1 shows the constitution of a conventional two-bit non-volatile memory.
Figure 1:
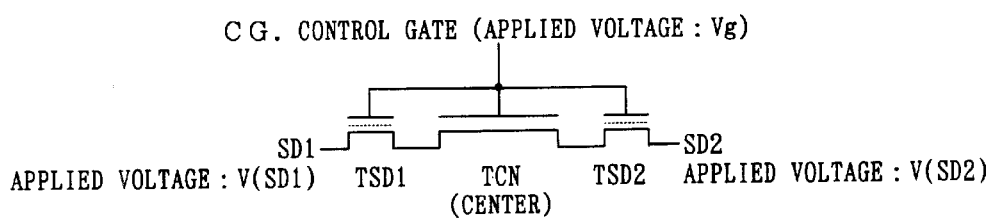
Figure 2:
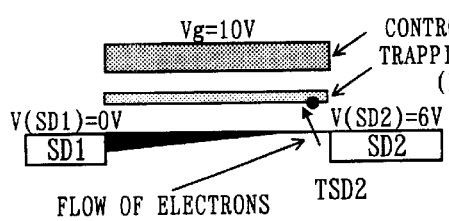
FIG. 2 serves to illustrate programming, erasure and read-out of a conventional two-bit non-volatile memory.
Figure 2:
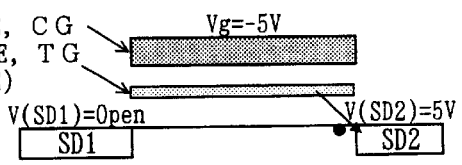
Figure 2:
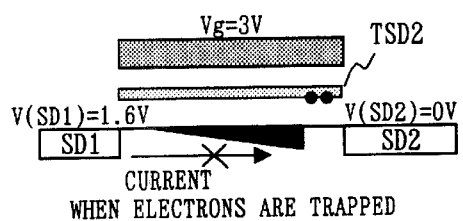
Figure 2:
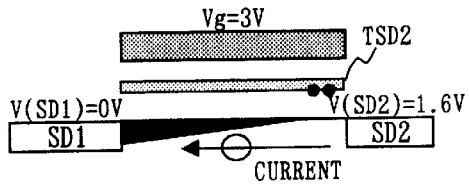
Figure 2:
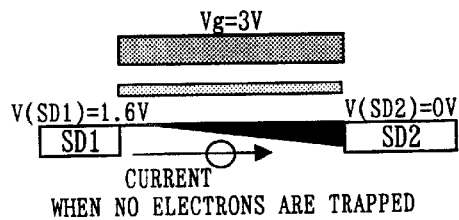
Figure 3:
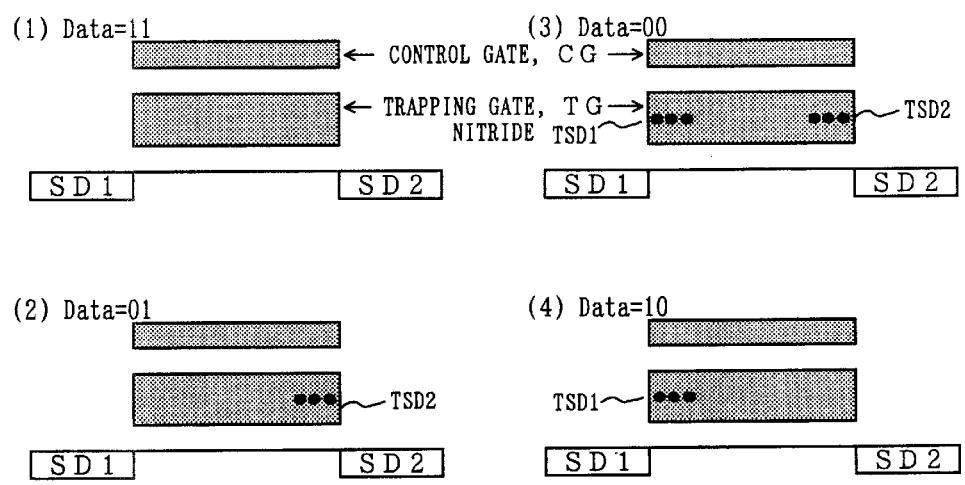
FIG. 3 shows a state in which two-bit information is recorded in a conventional non-volatile memory.

An embodiment of the present invention will be described hereinbelow by referring to the drawings. However, this embodiment does not limit the technological scope of the present invention.

As shown in FIG. 1, the non-volatile memory according to the present embodiment comprises n-type first and second source-drain regions SD1, SD2 at the surface of a p-type semiconductor substrate 1, for example. Further, a silicon oxide film 2, a non-conductive trapping gate TG that consists of a silicon nitride film, for example, a silicon oxide film 2, and a conductive control gate CG, are sequentially formed on a channel region between the first and second source-drain regions SD1, SD2. The trapping gate TG is buried in the silicon oxide film 2 so as to be in an electrically floating state. Further, an insulating substance such as silicon nitride film is preferably used as the non-conductive material for the trapping gate TG.

The non-volatile memory according to the present embodiment has, in addition to a state in which electrons are trapped or not trapped locally in the trapping gate TG, a state in which electrons are trapped or not trapped in the whole of the trapping gate TG. In other words, as is shown in the conventional example of a non-volatile memory, two-bit information is recorded by trapping hot electrons locally in regions of the trapping gate TG in the vicinity of the first and second source-drain regions SD1, SD2. Furthermore, according to the present embodiment, an electric field is applied between the control gate CG and the semiconductor substrate 1 to perform tunnel injection of electrons into the whole of the trapping gate TG such that the electrons are trapped in the whole of the trapping gate, to also record one bit information.

Figure 4:
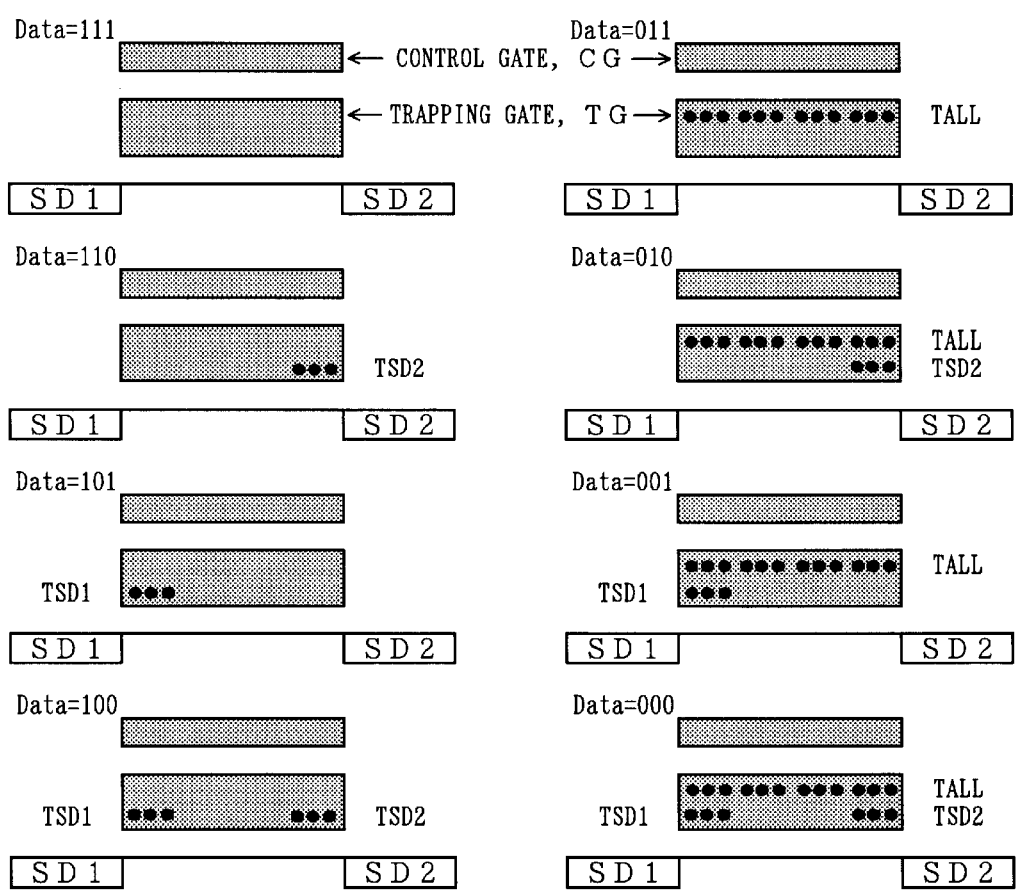
FIG. 4 shows the trapped state of electrons corresponding to three-bit information, in a non-volatile memory according to the present embodiment.

FIG. 4 shows the trapped state of electrons corresponding to three-bit information, in a non-volatile memory according to the present embodiment. Further, FIG. 5 similarly shows the state of the threshold voltages corresponding to three-bit information in a non-volatile memory according to the present embodiment. In FIG. 4, combinations or two states are shown, namely: a state in which electrons are trapped in the whole of the trapping gate TG (TALL), and a state in which electrons are trapped in localized regions in the trapping gate TG in the vicinity of the first and second source, drain regions SD1, SD2, namely in first and second trapping gate regions TSD1, TSD2. In addition, in FIG. 5, the memory cell channel region is divided into a section which corresponds to the first and second trapping gate regions TSD1, TSD2, and a section which corresponds to a central region TCN, of the trapping gate, between the first and second trapping gate regions TSD1, TSD2, and the respective threshold voltage states of these regions are shown.

Figure 5:
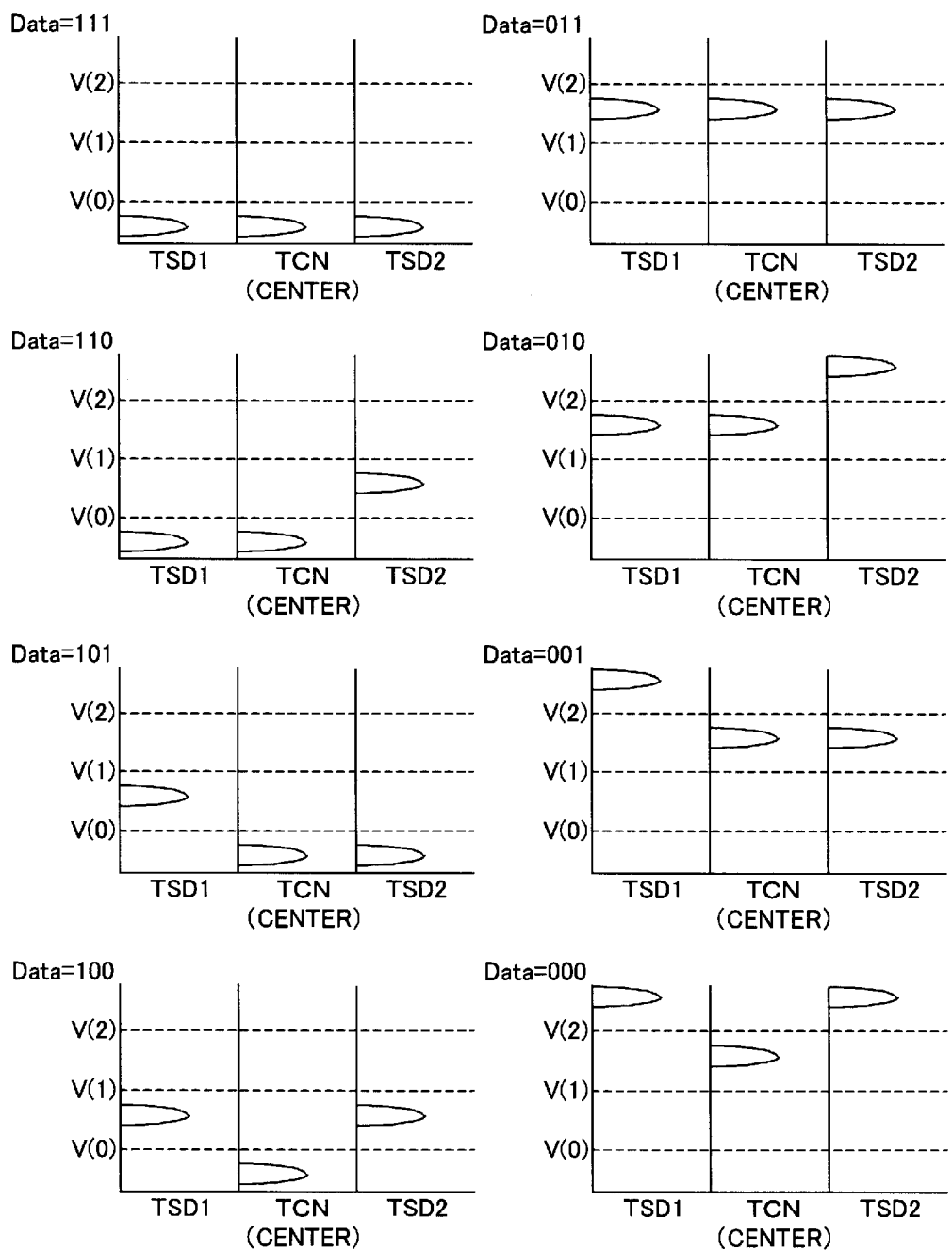
FIG. 5 shows the state of a threshold voltage corresponding to three-bit information in a non-volatile memory according to the present embodiment.

Furthermore, the voltages V(0), V(1), V(2) shown in FIG. 5, represent the first, second and third read-out voltages which are applied to the control gate CG during read-out. In addition, in the present embodiment, data 0 corresponds to a state in which current does not flow (no conduction) in the channel upon application of a read-out voltage, and data 1 corresponds to a state in which a channel current flows (conduction) at this time.

The non-volatile memory according to the present embodiment stores three-bit information. And, information is stored as highest-order bit information depending on the capture or the non-capture of electrons in the whole of the trapping gate TG, as second-bit information depending on the capture or the non-capture of electrons in the first trapping gate region TSD1, and as third-bit (lowest-order bit) information depending on the capture or the non-capture of electrons in the second trapping gate region TSD2.

Initially, the memory cell stores data=111 in a state in which no electrons whatever are trapped in the trapping gate TG. In this state, as shown in FIG. 5, the threshold voltage in each of the three regions TSD1, TSD2, TCN (trapping gate central region) is in a low state, in other words in a state that is lower than the voltage V(0).

Subsequently, the memory cell stores data=110 in a state in which electrons are trapped in the second trapping gate region TSD2. In this state, as shown in FIG. 5, only the threshold voltage in region TSD2 is higher than the first read-out voltage V(0). The threshold voltage in the other regions TSD1, TCN therefore remains lower than the first read-out voltage V(0).

Further, the memory cell stores data=101 in a state in which electrons are trapped in the first trapping gate region TSD1. In this state, as shown in FIG. 5, only the threshold voltage in region TSD1 is higher than the first read-out voltage V(0). The threshold voltage in the other regions TSD2, TCN therefore remains lower than the first read-out voltage V(0).

In addition, the memory cell stores data=100 in a state in which electrons are trapped in the first and second trapping gate regions TSD1, TSD2. In this state, as shown in FIG. 5, the threshold voltage in regions TSD1, TSD2 is higher than the first read-out voltage V(0) and the threshold voltage in the central region TCN therefore remains lower than the first read-out voltage V(0).

The above-mentioned three states may be read out by utilizing the second read-out voltage V(1) and the first read-out voltage V(0) as described later.

Data=011, 010, 001, 000 are states in which electrons are trapped in the whole of the trapping gate TG, and, as described hereinabove, these states correspond respectively to a state (011) in which electrons are not trapped in the first and second trapping gate regions TSD1, TSD2, a state (010) in which electrons are trapped in the second trapping gate region TSD2, a state (001) in which electrons are trapped in the first trapping gate region TSD1, and a state (000) in which electrons are trapped in the first and second trapping gate regions TSD1, TSD2.

In this case, as shown in FIG. 5, the four states mentioned above are such that, in all the regions TSD1, TSD2, TCN, the threshold voltage is higher than the second read-out voltage V(1). In addition, the four state a redivided whether the regions TSD1, TSD2 are higher or lower than the third read-out voltage V(2). In other words, when electrons are injected, as a result of the Fowler-Nordheim tunnel effect (referred to as the FN tunnel effect hereinafter), into the whole of the trapping gate TG, the threshold voltage of the memory cell trapping gate is higher than the second read-out voltage V(1). In addition, when tunnel injection of electrons is performed locally, into the first or second trapping gate region TSD1 or TSD2, the threshold voltage corresponding to each of these regions is higher than the third read-out voltage V(2).

As a result, the four states mentioned above can be read out by means of the second read-out voltage V(1) and the third read-out voltage V(2).

Next, a write (programming) operation, read-out operations, and erase operations, of the non-volatile memory according to the present embodiment, will be described sequentially.

First Read-out Operation

Figure 6:
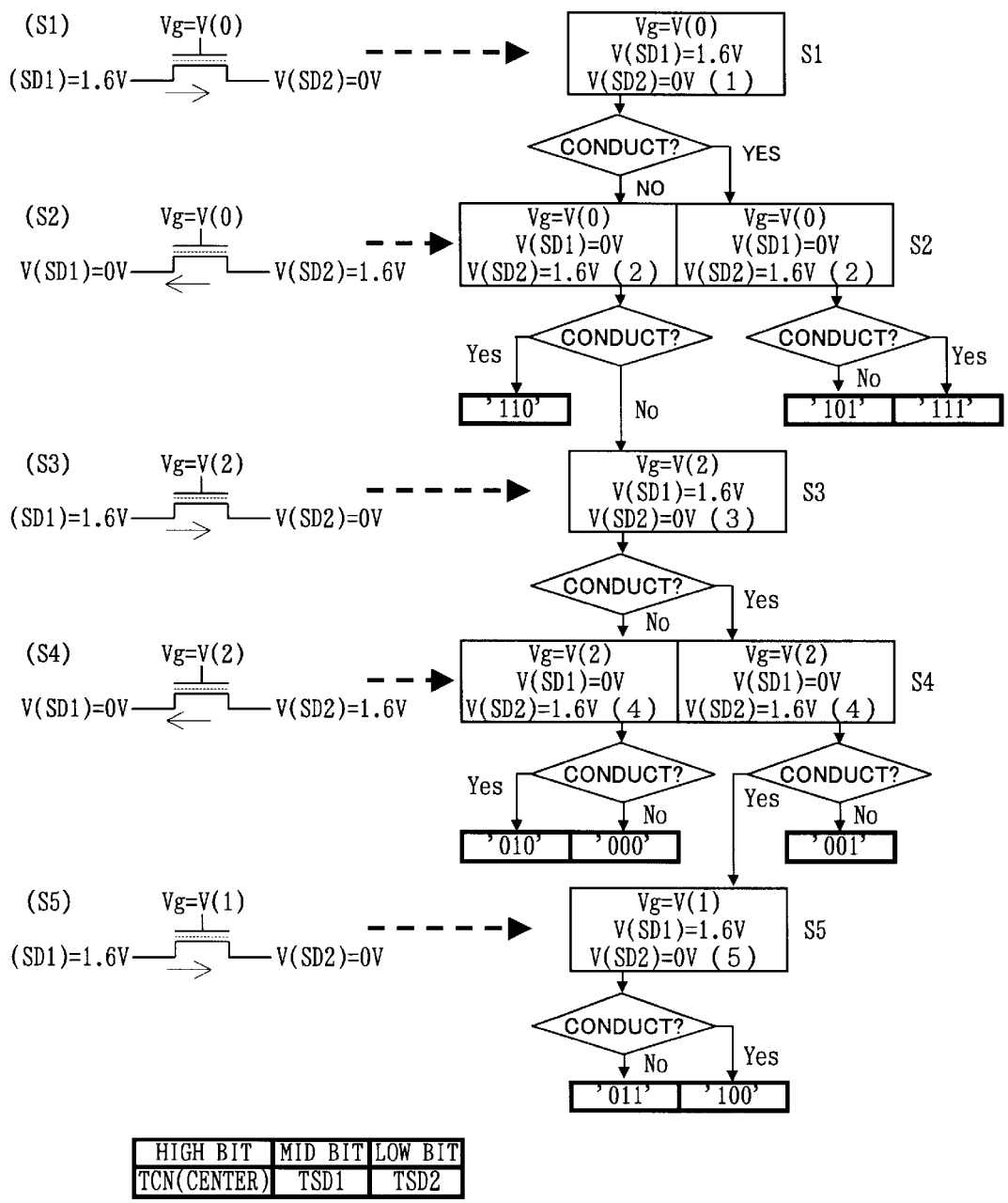
FIG. 6 is a flow chart for a first read-out operation in a non-volatile memory according to the present embodiment.

As a first read-out operation, a case will be described in which three-bit data is read-out at once. FIG. 6 is a flow chart for a first read-out operation in a non-volatile memory according to the present embodiment. In order to detect three-bit data, five steps S1 to S5 are required. As described hereinbelow, read-out is performed by suitably applying the first, second and third read-out voltages V(0), V(1), V(2) to the control gate CG, and by suitably applying voltages V(SD1), V(SD2) to the first and second source-drain regions such that an electric field results in a rightward or leftward direction between the two regions.

First of all, as shown in step S1, the voltages applied to the memory cell are Vg=V(0), V(SD1)=1.6V, V(SD2)=0V. Thereupon, if there is conduction in the cell transistor (read-out data 1), the threshold voltage at the center (abbreviated as Vt#center hereinbelow) is smaller than the first read-out voltage V(0), and the threshold voltage in the vicinity of the second trapping gate region TSD2 (abbreviated as Vt#sd2 hereinbelow) is also smaller than the first voltage V(0), and, as a result, it is known that the data stored is 101 or 111. If there is no conduction in the cell trapping gate (read-out data 0), it is to be considered that the threshold voltage at the center Vt#center>V(0) or that Vt#sd2 >V(0), and it may thus be detected that data other than 101 or 111 is stored.

Next, as shown in step S2, the voltage applied to the control gate remains as Vg=V(0), and the applied voltages V(SD1) and V(SD2) of the first and second source-drain regions are switched. Thereupon, in a case in which data 1 is read out as a result of conduction in-step S1, and data 1 is read out as a result of conduction also in step S2, since the threshold voltage is Vt#center<V(0) and Vt#sd2<V(0), and the threshold voltage in the vicinity of the first trapping gate region TSD1 (abbreviated as Vt#sd1 hereinbelow) is also smaller than the first read-out voltage V(0), the data is specified as being 111. In a case in which data 1 is read out as a result of conduction in step S1, and data 0 is read out as a result of non-conduction in step S2, since the threshold voltage is Vt#center<V(0), Vt#sd2<V(0), and Vt#sd1>V(0), the data is specified as being 101.

On the other hand, in a case in which data 0 is read out as a result of non-conduction in step S1, and data 1 is read out as a result of conduction in step S2, since the threshold voltage is Vt#center<V(0), Vt#sd2>V(0), and Vt#sd1<V(0), the data is specified as being 110. In a case in which data 0 is read out as a result of non-conduction in step S1, and data 0 is read out as a result of non-conduction also in step S2, it is to be considered that Vt#center>V(0) or that Vt#sd2>V(0) and Vt#sd1>V(0), and it may thus be judged that data, other than the specified data mentioned above, is stored.

Subsequently, in step S3, voltages applied to the memory cell are: Vg=V(2), V(SD1)=1.6V, V(SD2)=0V. Thereupon, if, as a result of non-conduction in the cell transistor, read-out data is 0, the threshold voltage is Vt#sd2>V(2), whereby it is known that the stored data is 010 or 000. Further, if read-out data is 1 as a result of conduction in the cell transistor, the threshold voltage is Vt#sd2 <V(2), whereby it is known that the stored data is 001, 100 or 011.

Next, in step 4, the voltages applied to the control gate are: Vg =V(2) (remains unchanged), and the voltages applied to the first and second source-drain regions V(SD1) and V(SD2) are switched. Thereupon, in a case in which data 0 is read out as a result of non-conduction in step S3, and data 0 is read out as a result of non-conduction also in step S4, since the threshold voltage is Vt#sd2>V(2) and Vt#sd1>V(2), the data is specified as being 000.

On the one hand, in a case in which data 0 is read out as a result of non-conduction in step S3, and data 1 is read out as a result of conduction in step S4, since the threshold voltage is Vt#sd2>V(2) and Vt#sd1<V(2), data is specified as being 010.

On the other hand, in a case in which data 1 is read out as a result of conduction in step S3, and data 0 is read out as a result of non-conduction in step S4, since the threshold voltage is Vt#sd2<V(2) and Vt#sd1>V(2), data is specified as being 001. In addition, in a case in which data 1 is read out as a result of conduction in step S3, and data 1 is read out as a result of conduction also in step S4, two states may be considered in which Vt#center<V(0), Vt#sd2>V(0) and Vt#sd1>V(0), or that vt#center>V(0), Vt#sd2<V(2) and Vt#sd1 <V(2). In other words, data is 100 or 011.

Finally, in order to make a selection between 100 and 011, as shown in step S5, applied voltages are: Vg=V(1), V(SD1)=1.6V, V(SD2)=0V. The voltages applied to the first and second source-drain regions V(SD1) and V(SD2) may therefore be reversed here. Thereupon, since the second read-out voltage V(1) is applied to the control gate, if data 1 is read-out as a result of conduction in the cell transistor, the threshold voltage is Vt#center<V(1), whereby data is specified as being 100. Conversely, if data 0 is read out as a result of non-conduction, the threshold voltage is Vt#center>V(1), whereby data is specified as being 011.

The above example of voltage application sequence to a memory cell represents one example thereof, and a variety of modified examples are conceivable. For example, by initially setting the voltage Vg, which is applied to the control gate CG, as the second read-out voltage V(1), as in step S5 mentioned above, and thus checking whether or not conduction takes place, it is possible to distinguish the highest-order bit as being either 0 or 1. Thereafter, by executing the above-mentioned steps S1, S2, it is possible to detect data 111 to 100. Alternatively, by executing the above-mentioned steps S3, S4, it is possible to detect data 011 to 000.

Figure 7:
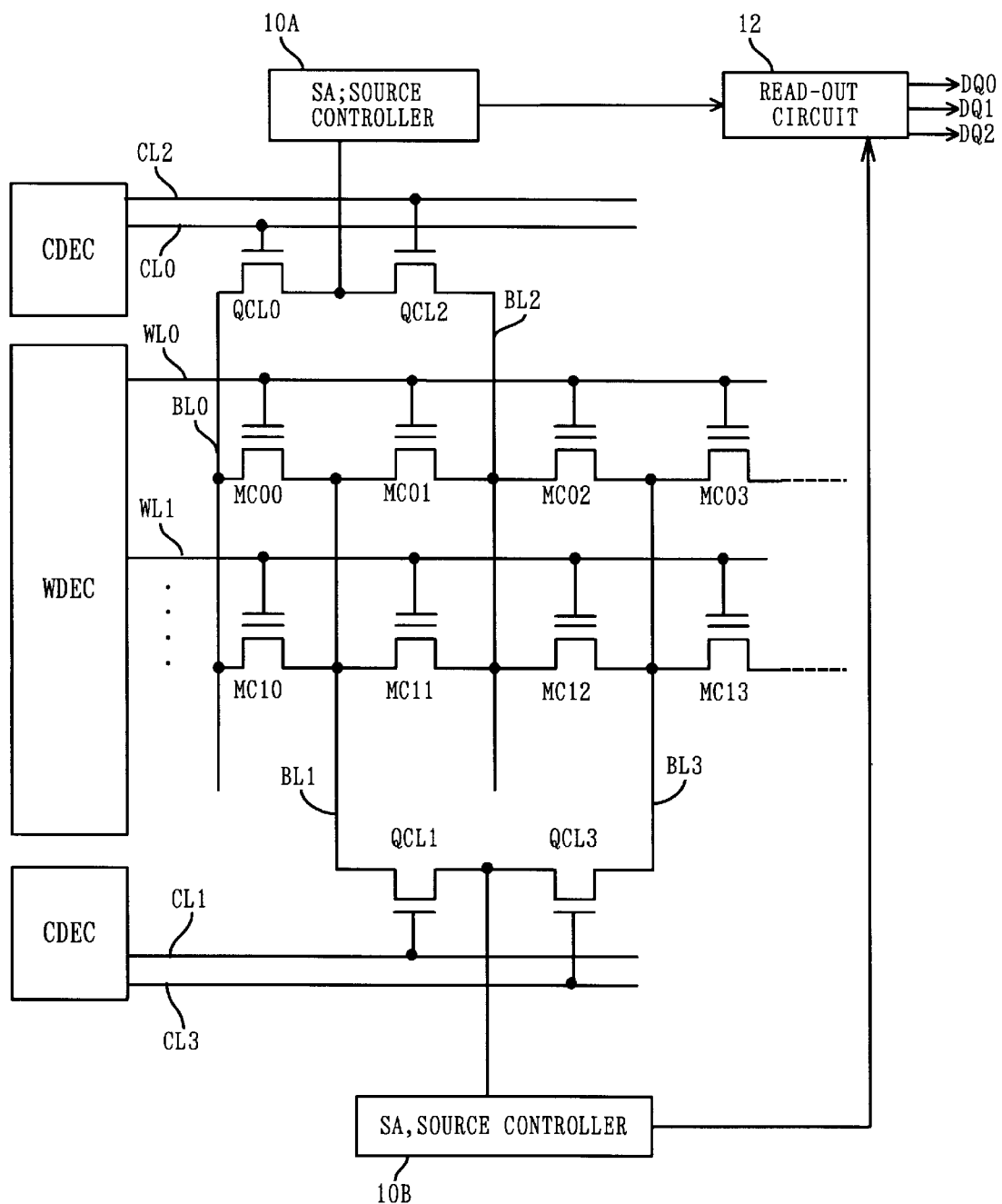
FIG. 7 is a circuit diagram showing an example of a memory cell array according to the present embodiment.

FIG. 7 is a circuit diagram showing an example of a memory cell array according to the present embodiment. In FIG. 7, four bit lines BL0 to BL3 and two word lines WL0, WL1 are shown, and memory cells MC00 to MC13 are arranged at points of intersection between these bit lines and word lines. The first and second source-drain regions of these memory cells are connected to the bit lines, and the control gates of the memory cells are connected to the word lines.

Word lines are selected by a word decoder WDEC, and bit lines are connected to sense amplifier/source control circuits 10A, 10B via transistors, being selected by a column select signal CL0 to CL3 selected by a column decoder. Further, data read out by these circuits 10A, 10B is supplied to a read-out circuit 12, and data of three bits, which results from the above-mentioned read-out sequence is output to output terminals DQ0 to DQ2.

By means of suitable combination of the conduction of upper and lower column gate transistors QCL0 to QCL3, it is possible to apply read-out voltages to the first and second source-drain regions of the memory cells, and to thus read out data 1 or 0 that corresponds to conduction or non-conduction of a memory cell.

Second Read-out Operation

Figure 8:
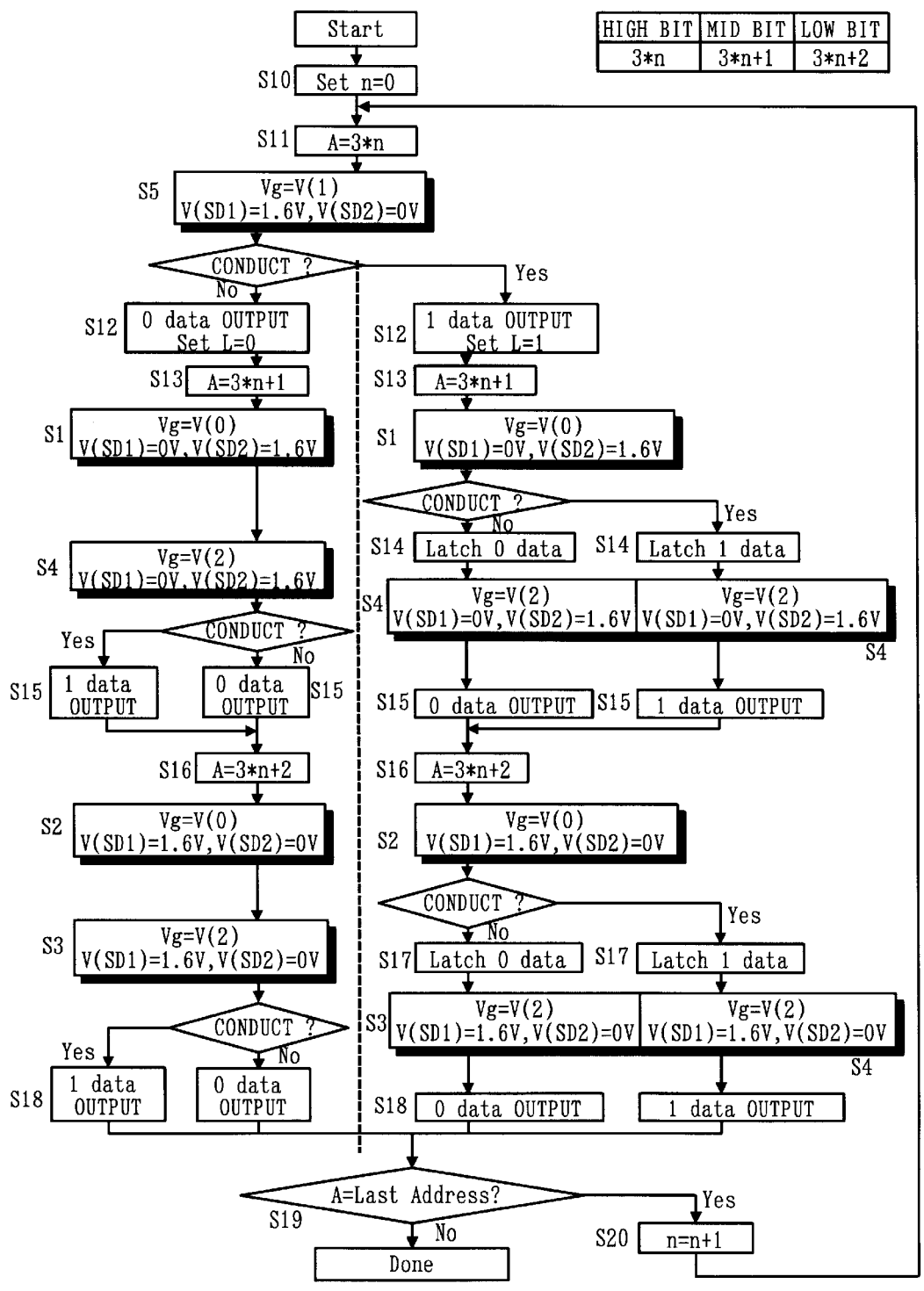
FIG. 8 is a flow chart for a second read-out operation in a non-volatile memory according to the present embodiment.
Figure 9:
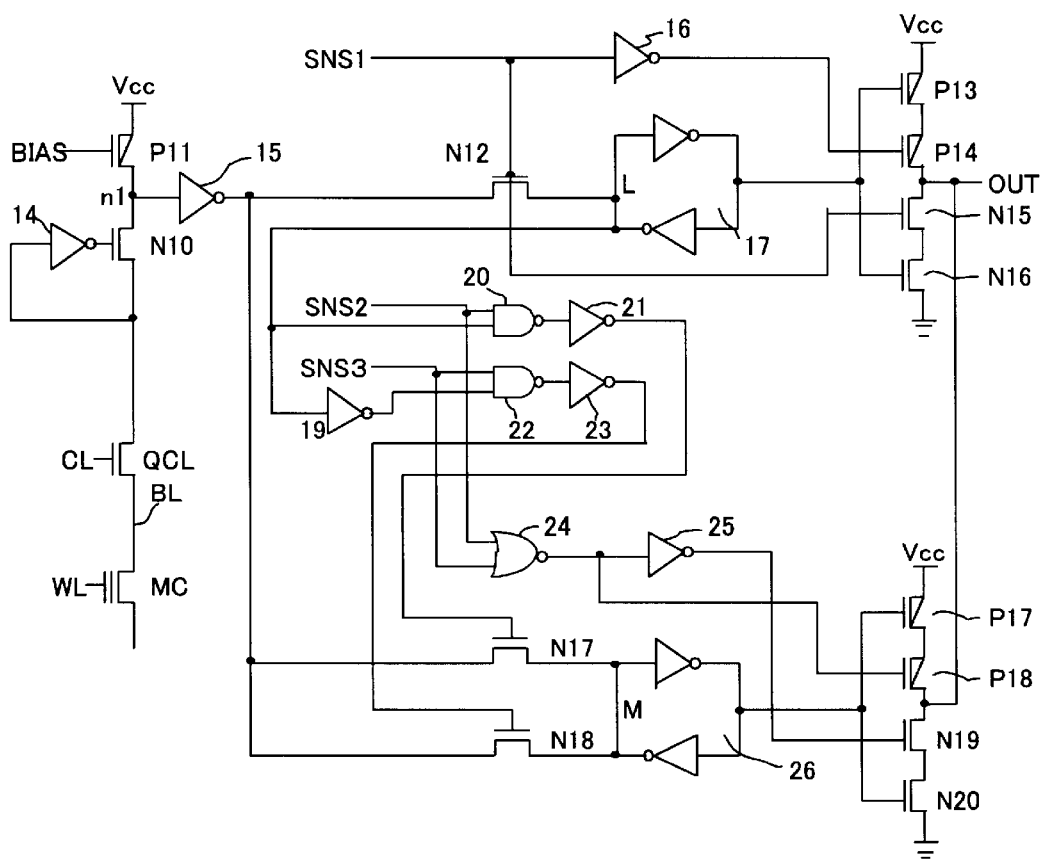
FIG. 9 is a circuit diagram of a sense amplifier circuit which is utilized in the second read-out operation.

Next, a second read-out operation, in which three-bit data is read out sequentially, will be described. FIG. 8 is a flow chart for a second read-out operation in a non-volatile memory according to the present embodiment. Further, FIG. 9 is a circuit diagram of a sense amplifier circuit employed in this case. Steps S1 to S5 in FIG. 8 correspond to steps S1 to S5 in FIG. 6.

In the second read-out operation, since three-bit data is stored in each memory cell, the read-out operation is performed by means of the allocation of the addresses 3*n, 3*n+1, 3*n+2 (with the condition that n is equal to or greater than 0) to the highest-order digit (electrons are trapped or not trapped in the whole of the trapping gate), to the second digit (electrons are trapped or not trapped in the first trapping gate region), and to the third digit (electrons are trapped or not trapped in the second trapping gate region)respectively. Therefore, in FIG. 8, A indicates the above addresses.

The sense amplifier circuit shown in FIG. 9 is constructed such that a pre-sense circuit, which comprises transistors P11, N10, are connected to a bit line BL via a column gate transistor QCL, and connected to a main amp via an inverter 15. Highest-order digit data, which indicates whether or not electrons are trapped in the whole of the trapping gate, is latched by a latch circuit 17, and output to an output terminal OUT via output inverter of P13, P14, N15, N16. Further, second digit and third digit data, which indicate whether or not electrons are trapped in the first and/or second trapping gate regions, is latched by the latch circuit 26, and output to an output terminal OUT via output inverter of P17, P18, N19, N20.

As shown in FIG. 8, data read-out is begun with n initially set as 0 (S10), and the address A as the address 3*n for the highest-order digit (S11).

As an initial read-out step, as shown in step S5, the second read-out voltage is applied to the control gate (Vg=V(1)) to check whether or not electrons have accumulated in the whole of the trapping gate. For this purpose, in the sense amplifier circuit of FIG. 9, the voltage application is: SNS1=High, SNS2=SNS3=Low, and transistors N12, P14, N15 are therefore conductive and transistors N17, N18 are non-conductive.

If electrons have accumulated in the whole of the trapping gate, the memory cell MC is not conductive, and node n1 is at an H level, and data is inverted by the inverter 15, latched by the latch circuit 17, and the output is OUT=Low (data 0). If there is no accumulation of electrons in the whole of the trapping gate, the reverse is true, and the output is OUT=High (data 1). This is 0 address data. At this time, since the control signal is SNS1=High, the node L within the latch circuit 17 is set as Low or High according to the non-conduction or conduction of the memory cell that depend on the accumulation and non-accumulation of electrons (S12).

Next, the address is incremented by one to become A=3*n+1 (S13), and a check is performed for the existence of electrons in the first trapping gate region TSD1. Further, the voltage of the control gate is set as first read-out voltage Vg=V(0), and the voltage of the first and second source-drain regions is set as V(SD1)=0V, V(SD2)=1.6V (S1). Further, the control signals in the sense amplifier circuit are set as SNS1=Low, SNS2=High, SNS3=Low.

At this time, if, in the above-mentioned highest-order bit read-out operation, in a state of non-conduction as a result of electrons being trapped, the output is OUT=Low (data 0), the memory cell need not be read in this step S1, and data output is not performed. On the other hand, if, in the course of highest-order bit read-out, OUT=High (data 1), it is necessary to sense the second digit bit of the memory cell. In other words, in the sense amplifier circuit of FIG. 9, the node L is set to High, the NAND gate 20 outputs an L level, and the transistor N17 is conductive, and the output of the inverter 15 is via the transistor N17 and is latched by the latch circuit 26.

If electrons have accumulated in the first trapping gate region TSD1, the memory cell MC is non-conductive, and the node M in the latch circuit 26 is M=Low, and, if there is no accumulation of electrons, the memory cell is conductive, and the node M is M=High. Since the control signal SNS2=High, the transistors gates P18, N19 assume a conductive state, and a CMOS inverter is activated, and, depending on whether the node M is High or Low, High (data 1) or Low (data 0) is output by the output OUT.

Next, in order to determine the data of the memory cell when the output is OUT=Low (data 0) during highest-order digit read-out, the voltages applied to the memory cell are Vg=V(2), V(SD1)=0V, V(SD2)=1.6V (S4). Further, the control signals of the sense amplifier circuit are SNS1=SNS2=Low, SNS3=High. At this time, if electrons have accumulated in the first trapping gate region TSD1, more than the case of electrons being accumulated in the whole of the trapping gate, the memory cell is non-conductive, and the output is therefore OUT=Low, and, if electrons have accumulated less than that, the memory cell is conductive and the output is therefore OUT=High (data 1) (S15). Data obtained by means of the above steps S1 and S4 is second digit data.

In addition, the address is incremented by one to become A=3*n+2 (S16). Further, the voltages applied to the memory cell are Vg=V(0), V(SD1)=1.6V, V(SD2)=0V (S2). At this time, the control signals are SNS1=Low, SNS2=High, SNS3 Low. Thereupon, if, in the above-mentioned highest-order digit read-out operation, OUT=Low (data 0), the memory cell need not be read, and data output is not performed. On the other hand, if, in the course of highest-order digit read-out, OUT=High (data 1), the sensing of the memory cell is necessary, and, similarly to second digit read-out, the transistor N17 is conductive, and data is latched by the latch circuit 26.

If electrons have accumulated in the second trapping gate region TSD2, the memory cell is non-conductive, and the node M is M=Low, and, if there is no accumulation of electrons, the memory cell is conductive, and the node M=High. Since the control signal SNS2=High, depending on whether the node M is High or Low, High (data 1) or Low (data 0) is output by the output OUT (S17).

Next, in order to determine the data of the memory cell when the output is OUT=Low (data 0) during highest-order digit read-out, the voltages applied to the memory cell are Vg=V(2), V(SD1)=1.6V, V(SD2)=0V (S4). Here, the control signals are SNS1=SNS2=Low, SNS3=High.

At this time, if electrons have accumulated in the second trapping gate region TSD2, more than the case of electrons being accumulated in the whole of the trapping gate region, the memory cell is non-conductive, and the output is therefore OUT=Low (data 0), and, if electrons have accumulated less than that, the memory cell is conductive and the output is therefore OUT=High (data 1) (S18). Data read out by means of the above steps S2 and S4 is third digit data.

In the description hereinabove, data was read out sequentially that corresponds to three addresses with respect to a single memory cell. Thereafter, read-out proceeds with respect to the next memory cell, and the same operation is repeated until the last address is reached. Naturally, this read-out operation may be halted midway through, and read-out is possible in sequence not from a 0 address but instead from any given address.

Write (Programming) Operation

Figure 10:
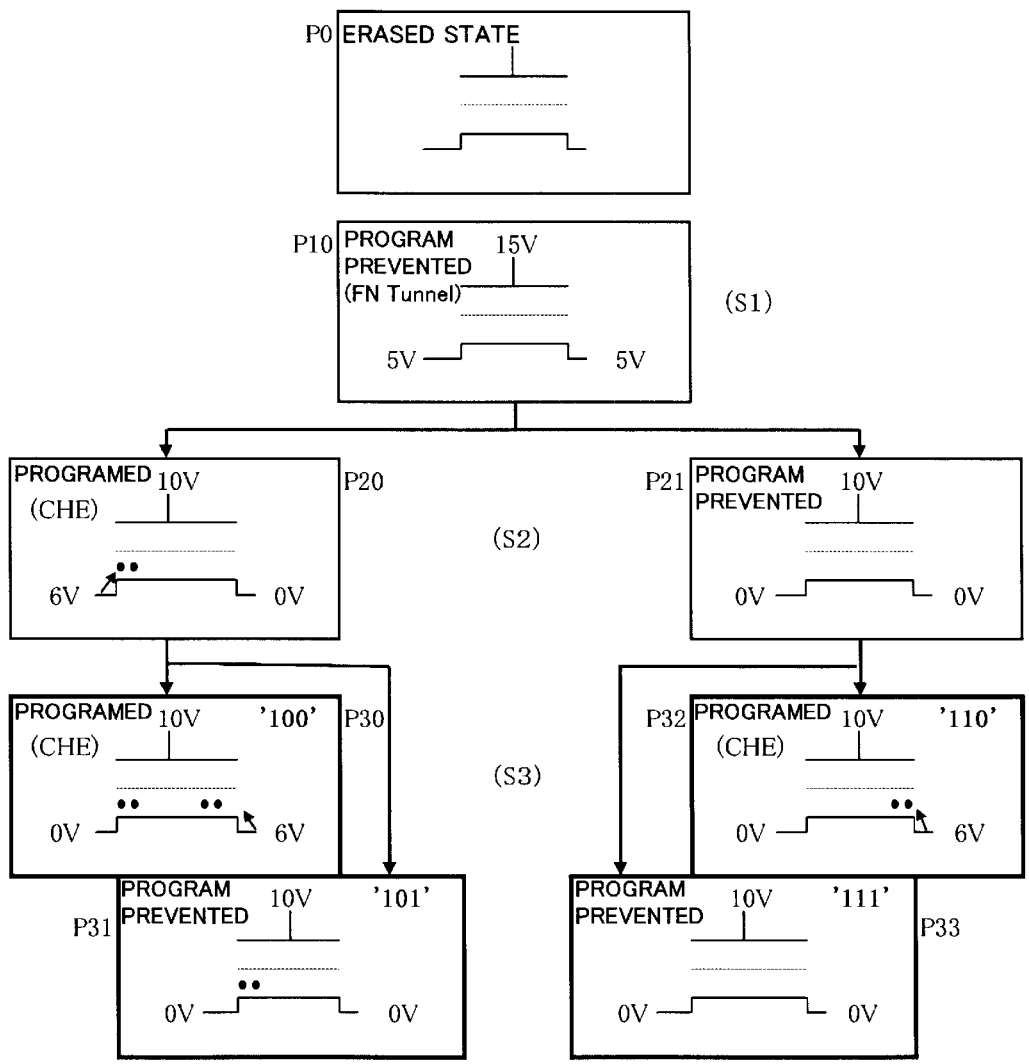
FIG. 10 is a flow chart to illustrate a write (programming) operation in a non-volatile memory according to the present embodiment.
Figure 11:
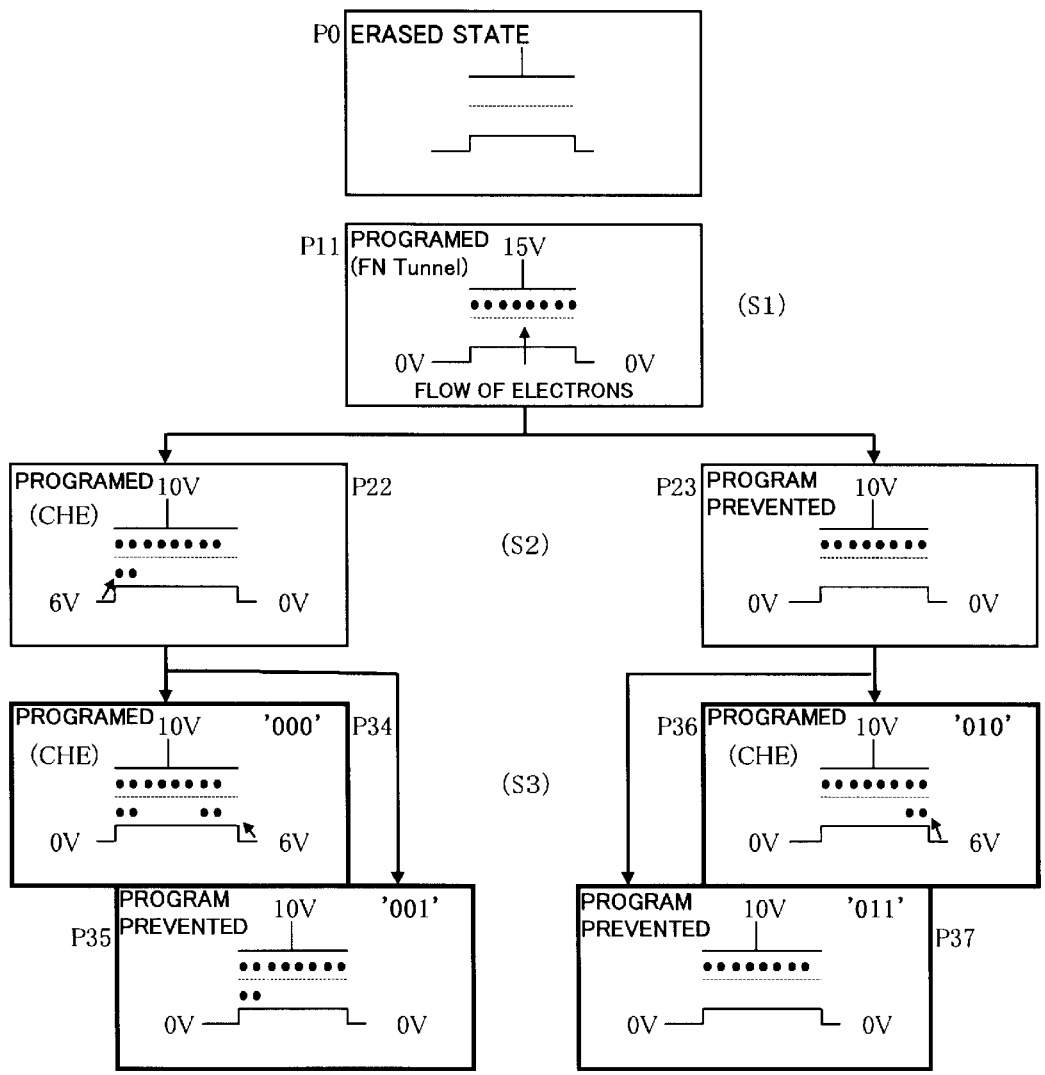
FIG. 11 is a flow chart to illustrate a write (programming) operation in a non-volatile memory according to the present embodiment.

FIGS. 10 and 11 are flow charts to illustrate a write (programming) operation in a non-volatile memory according to the present embodiment. FIGS. 10 and 11 show flow charts in which, from an erased state P0 in which no electrons are trapped by the trapping gate TG, write steps S1, S2, S3 are performed in order to arrive at eight write states P30 to P37 for three-bit information. FIGS. 10 and 11 should be positioned side by side, so that all the write (programming) steps are illustrated.

Ordinarily, in a memory cell array, memory cells are provided at the intersections between word lines and bit lines. Further, different data is typically written to a plurality of memory cells by applying predetermined voltages to a control gate CG, first and second source-drain regions SD1, SD2, and a channel region, of these memory cells. Therefore, FIGS. 10 and 11 show write steps according to which writing is possible to such a plurality of memory cells.

First of all, in accordance with FIG. 10, a case will be described in which, following an erased state P0, data=100, 101, 110, 111 is written to memory cells.

Writing is performed in three steps S1, S2, S3. In step S1, since the accumulation of electrons in the whole of the trapping gate TG is not desired, as shown by the state P10, the applied voltages are: Vg=15V, V(SD1)=5V, V(SD2)=5V, and, through prevention of the FN tunnel effect, electron injection from the channel to the trapping gate TG is prevented. Thereupon, in the above-described write steps of FIG. 11, electrons are injected into the memory cells to write data=000, 001, 010, 011.

Next, in step S2, as shown by the state P20, the voltages applied to the memory cells, to which data 100, 101 is written, are: Vg=10V, V(SD1)=6V, V(SD2)=0V, and thus channel hot electrons, which are produced by avalanche breakdown, are injected locally into the trapping gate region TSD1 in the vicinity of the first source-drain region SD1. Further, as shown by the state P21, voltages applied to the memory cells of data 110, 111 are: Vg=10V, V(SD1)=0V, V(SD2)=0V, since the injection of electrons into the trapping gate region TSD1 in the vicinity of the first source-drain region SD1 is not desired, whereby writing is prevented.

Following the write operation of step S2, a write verify is performed in which voltages applied to memory cells are Vg=V(0), V(SD1)=0V, V(SD2)=1.6V. If the verify operation yields a pass, step S3 follows, but if the result is a fail, step S2 is repeated until a pass is produced. If the write verify is passed, the threshold voltage of the first trapping gate region TSD1 rises above the first read-out voltage V(0). However, it is necessary to ensure here that the threshold level following writing does not rise above the second read-out voltage V(1). As a result, in a case in which a write verify is performed by the application of the second read-out voltage Vg=V(1) to the control gate CG, and the judgement yields a write state, an erase operation is performed in which voltages applied to a memory cell are: Vg=−5V, V(SD1)=5V, V(SD2) OPEN, and step S2 is then performed again.

Finally, in step S3, as shown by the states P30,P32, the voltages applied to the memory cells, to which data 100, 110 is written, are: Vg=10V, V(SD1)=0V, V(SD2)=6V, and thus channel hot electrons, which are produced by avalanche breakdown, are injected into the second trapping gate region TSD2 in the vicinity of the second source-drain region SD2. Further, as shown by the states P31, P33, voltages applied to the memory cells, to which data 101, 111 is written, are Vg 10V, V(SD1)=0V, V(SD2)=0V, since the injection of electrons into the second trapping gate region TSD2 in the vicinity of the second source-drain region SD2 is not desired, whereby writing is prevented.

Following the write operation, a write verify is performed in which voltages applied to memory cells are: Vg=V(0), V(SD1)=1.6V, V(SD2)=0V. If the verify operation yields a pass, the write operation is ended, but if the result is a fail, step S3 is repeated until a pass is produced. In this case, it is necessary to ensure that the threshold level following writing does not rise above the second read-out voltage V(1). For this reason, in a case in which a write verify is performed in which the voltage applied to the control gate is Vg=V(1), and the judgement yields a write state as a result of the non-conduction state of the memory cell, an erase operation is performed in which voltages applied are: Vg=−5V, V(SD1)=5V, V(SD2)=OPEN, and step S3 is then performed again.

Next, in accordance with FIG. 11, a case will be described in which, following an erased state P0, data=000, 001, 010, 011 is written to memory cells.

Similarly to the case in FIG. 10, the write operation is performed in three steps S1 to S3. In step S1, since the accumulation of electrons in the whole of the trapping gate TG is a requirement, as shown by the state P11, the applied voltages are: Vg=15V, V(SD1)=0V, V(SD2)=0V, and through use of the FN tunnel effect, electrons are injected from the channel to the trapping gate TG. Following the write operation, a write verify is performed in which the applied voltages are: Vg=V(1), V(SD1)=1.6V, V(SD2)=0V. As a result, if the verify operation yields a pass, step S2 follows, but if the result is a fail, step S1 is repeated until a pass is produced. When the write verify yields a pass, the threshold voltage is then higher than the second read-out voltage V(1).

Next, in step S2, as shown by the state P22, the voltages applied to the memory cells, to which data 000, 001 is written, are: Vg=10V, V(SD1)=6V, V(SD2)=0V, and thus channel hot electrons, which are produced by avalanche breakdown, are injected into the first trapping gate region TSD1. Further, as shown by the state P23, voltages applied to the memory cells, to which data 010, 011 is written, are Vg=10V, V(SD1)=0V, V(SD2)=0V, since the injection of electrons into the first trapping gate region TSD1 is not desired, whereby writing is prevented.

Following the write operation, a write verify is performed in which applied voltages are: Vg=V(2), V(SD1)=0V, V(SD2)=1.6V. If, as a result, the verify operation yields a pass, step S3 follows, but if the result is a fail, step S2 is repeated until a pass is produced. If the write verify is passed, the threshold voltage, of a channel region corresponding to the first trapping gate region TSD1, is higher than the third read-out voltage V(2).

Finally, in step S3, as shown by the states P34, P36, the voltages applied to the memory cells, to which data 000, 010 is written, are: Vg=10V, V(SD1)=0V, V(SD2)=6V, and thus channel hot electrons, which are produced by avalanche breakdown, are injected into the second trapping gate region TSD2. Further, as shown by the states P35, P37, voltages applied to the memory cells, to which data 001, 011 is written, are: Vg=10V, V(SD1)=0V, V(SD2)=0V, since the injection of electrons into the second trapping gate region TSD2 is not desired, whereby writing is prevented.

Following the write operation, a write verify is performed in which applied voltages are: Vg=V(2), V(SD1)=1.6V, V(SD2)=0V. If the verify operation yields a pass, the write operation is ended, but if the result is a fail, step S3 is repeated until a pass is produced. If the write verify is passed, the threshold voltage, which corresponds to the second trapping gate region TSD2, is higher than the third read-out voltage V(2).

Erase operations

The erase operations in a non-volatile memory according to the present embodiment are performed by means of extraction of electrons within the trapping gate TG toward the channel region through the use of the FN tunnel effect. Both in a case where electrons are injected into the whole of the trapping gate TG and in a case where electrons are trapped in the first and second trapping gate regions, total erasure can be performed in the same manner.

Figure 12:
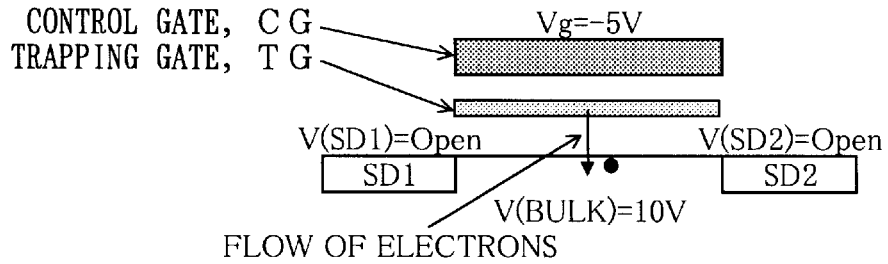
FIG. 12 shows an erase operation in a non-volatile memory according to the present embodiment.
Figure 12:
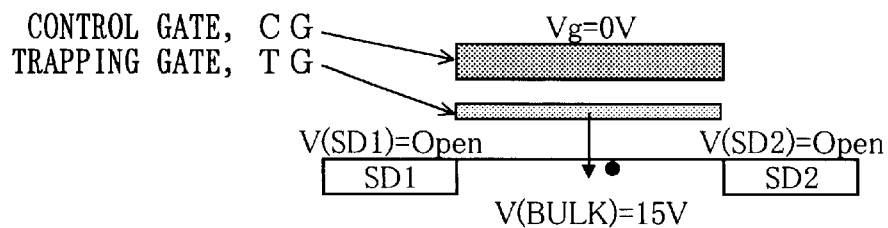
Figure 12:
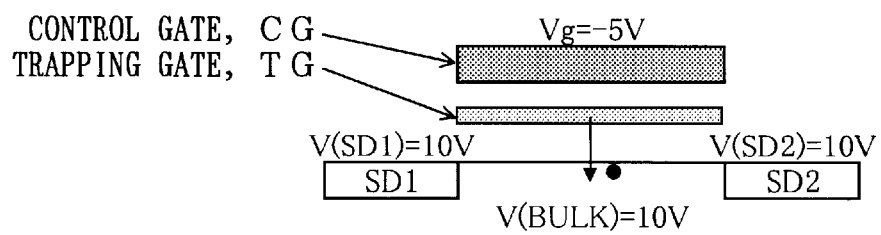
Figure 12:
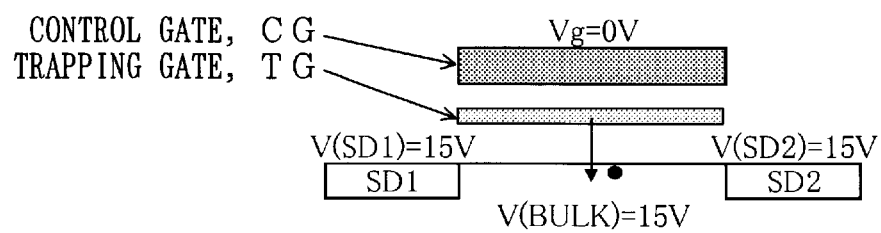

FIG. 12 shows an erase operation in a non-volatile memory according to the present embodiment. Four kinds of erase operation are illustrated in FIG. 12. In the erase operation of FIG. 12(a), when the voltage applied to the control gate CG is such that Vg=−5V, and the voltage applied to the channel region is such that V(BULK)=10V, and the first and second source-drain regions are Open (floating), electrons captured within the trapping gate TG pass through the gate oxide film beneath the trapping gate TG, as a result of the tunnel effect, to be thus extracted to the channel region.

In FIG. 12(b), the above-mentioned erase operation is performed using a positive voltage. In other words, the voltage applied to the control gate CG is such that Vg=0V, and the voltage applied to the channel region is such that V(BULK)=15V, and the first and second source-drain regions are Open (floating). As a result, electrons may be extracted in the same manner.

In the erase operation of FIG. 12(c), the channel region and the source-drain regions are at the same potential, so that the PN junction therebetween prevents a forward bias state from arising. In other words, the voltage applied to the control gate CG is such that Vg=−5V, and the voltage applied to the channel region is such that V(BULK)=10V, and the voltage applied to the first and second source-drain regions is also 10V. In this manner, electrons may be extracted as a result of the tunnel effect.

The erase operation of FIG. 12(d) performs the above operation using a positive voltage. In other words, the voltage applied to the control gate CG is such that Vg=0V, and the voltage applied to the channel region is such that V(BULK)=15V, and the voltage applied to the first and second source-drain regions is similarly 15V. In this manner, the PN junction of the source-drain regions is maintained at a forward bias, and electrons within the trapping gate TG may be extracted as a result of the tunnel effect.

The scope of protection of the present invention described hereinabove is not limited to the above-mentioned embodiment and includes inventions appearing in the patent claims and equivalent items.

INDUSTRIAL APPLICABILITY

The present invention described hereinabove permits the recording of multi-valued data in a single memory cell by utilizing a state in which a non-conductive trapping gate is buried within a gate insulating film and charge is injected into the whole of this trapping gate, and a state in which charge is locally injected into some regions of the trapping gate so as to be trapped therein.

What is claimed is:

1. A non-volatile memory for recording multiple bit information, having:
   first and second source-drain regions formed at the surface of a semiconductor substrate; and
   a first insulating layer, a non-conductive trapping gate, a second insulating layer, and a control gate, which are formed on a channel region between said first and second source-drain regions,
   wherein said non-volatile memory stores a first bit information based on whether or not charge is trapped locally in said trapping gate, and a second bit information based on whether or not charge is injected into the whole of said trapping gate.

2. The non-volatile memory according to claim 1, wherein said first bit information includes two bits information based on whether or not charge is trapped locally in first and second trapping gate regions in the vicinity of said first and second source-drain regions respectively.

3. The non-volatile memory according to claim 1 or claim 2, wherein, in writing the first bit information, a predetermined voltage is applied between said first and second source-drain regions to inject hot electrons produced in said channel region; into the trapping gate; and, in writing the second bit information, a predetermined voltage is applied between said semiconductor substrate and said control gate to perform tunnel injection of charge from the semiconductor substrate to the whole of said trapping gate.

4. The non-volatile memory according to claim 1 or claim 2, wherein an erase operation is performed by applying a predetermined erase voltage between said semiconductor substrate and said control gate to extract charge present in the whole of said trapping gate or in localized regions of said trapping gate.

5. The non-volatile memory according to claim 1 or claim 2, wherein the non-volatile memory has:

a first read-out voltage, a second read-out voltage, and a third read-out voltage, which differ in sequential order, and wherein said second read-out voltage is applied to said control gate to perform readout to detect the second bit information, and said first or third read-out voltage is applied to said control gate to perform read-out to detect the first bit information.

6. The non-volatile memory according to claim 2, wherein the non-volatile memory has:

a first read-out voltage, a second read-out voltage, and a third read-out voltage, which differ in sequential order, and wherein said second read-out voltage is applied to said control gate to perform read-out to detect the second bit information, and said first or third read-out voltage is applied to said control gate to perform read-out to detect the first bit information, and in read-out to detect said first bit information, a voltage, which is higher than the voltage applied to the second source-drain region, is applied to said first source-drain region to perform read-out to detect one bit information of the first bit information with respect to said second trapping gate region, and a voltage, which is higher than the voltage applied to the first source-drain region, is applied to said second source-drain region to perform read-out to detect the other bit information of the first bit information with respect to said first trapping gate region.

7. A non-volatile memory for recording multiple bit information, having:

first and second source-drain regions formed at the surface of a semiconductor substrate; and a first insulating layer, a non-conductive trapping gate, a second insulating layer, and a control gate, which are formed on a channel region between said first and second source and drain regions, wherein said non-volatile memory stores a first bit information based on whether or not charge is trapped locally in a first trapping gate region in said trapping gate, in the vicinity of said firth source-drain region, a second bit information based on whether or not charge is trapped locally in a second trapping gate region in said trapping gate, in the vicinity of said second source-drain region; and a third bit information based on whether or not charge is injected into the whole of said trapping gate.

8. The non-volatile memory according to claim 7, wherein, in writing the first or second bit information, a predetermined voltage is applied between said first and second source-drain regions to inject hot electrons produced in said channel region to the trapping gate; and in writing the third bit information, a predetermined voltage is applied between said semiconductor substrate and said control gate to perform tunnel injection of charge from the semiconductor substrate to the whole of said trapping gate.

9. The non-volatile memory according to claim 8, wherein an erase operation is performed by applying a predetermined erase voltage between said semiconductor substrate and said control gate to extract charge present in the whole of said trapping gate or in localized regions of said trapping gate.

10. The non-volatile memory according to claim 7, wherein the non-volatile memory has:

a first read-out voltage, a second read-out voltage, and a third read-out voltage, which differ in sequential order, and wherein said second read-out voltage is applied to said control gate to perform read-out to detect the third bit information, and said first or third read-out voltage is applied to said control gate to perform read-out to detect the first or second bit information.

* * * * *